United States Patent

Kojima

[11] Patent Number: 6,132,910
[45] Date of Patent: Oct. 17, 2000

[54] METHOD OF IMPLEMENTING ELECTRON BEAM LITHOGRAPHY USING UNIQUELY POSITIONED ALIGNMENT MARKS AND A WAFER WITH SUCH ALIGNMENT MARKS

[75] Inventor: Yoshikatsu Kojima, Tokyo, Japan

[73] Assignee: NEC Corporation, Tokyo, Japan

[21] Appl. No.: 09/204,940

[22] Filed: Dec. 3, 1998

[30] Foreign Application Priority Data

Dec. 4, 1997 [JP] Japan ................................ 9-334588

[51] Int. Cl.$^7$ ........................................... G03F 9/00
[52] U.S. Cl. .......................... 430/22; 430/296; 438/975
[58] Field of Search ....................... 430/22, 296; 438/975

[56] References Cited

U.S. PATENT DOCUMENTS

| | | | |
|---|---|---|---|
| 5,721,619 | 2/1998 | Hiruma et al. | 430/22 |
| 5,792,580 | 8/1998 | Tomimatu | 430/22 |
| 5,837,404 | 11/1998 | Lu | 430/22 |
| 5,849,436 | 12/1998 | Yamada et al. | 430/22 |
| 5,849,441 | 12/1998 | Nara et al. | 430/22 |
| 5,868,560 | 2/1999 | Tamada et al. | 430/22 |

FOREIGN PATENT DOCUMENTS

| | | |
|---|---|---|
| 1-204419 | 8/1989 | Japan . |
| 5-82428 | 4/1993 | Japan . |
| 8-97114 | 4/1996 | Japan . |

Primary Examiner—Christopher G. Young
Attorney, Agent, or Firm—Hutchins, Wheeler & Dittmar

[57] ABSTRACT

A plurality of alignment marks are formed on a semiconductor wafer in an area which is separate from or non-coincident with outside a plurality of chip regions, such as in a periphery of the wafer, irrespectively of the size and arrangement of the chip regions. Such wafers, which are previously manufactured, are then subjected to electron beam exposure in accordance with circuit design data. The electron beam exposure is typically implemented through global alignment using the alignment marks.

6 Claims, 6 Drawing Sheets

METHOD OF IMPLEMENTING ELECTRON BEAM LITHOGRAPHY USING UNIQUELY POSITIONED ALIGNMENT MARKS AND A WAFER WITH SUCH ALIGNMENT MARKS

BACKGROUND OF THE INVENTION

1. Field of the Invention

The present invention relates generally to improvements in electron beam exposure for writing desired patterns on a semiconductor wafer, and more specifically to a method of implementing electron beam lithography using uniquely positioned alignment marks. Still more specifically, the present invention relates to a semiconductor wafer itself which is previously provided with the above mentioned alignment marks.

2. Description of Related Art

As the feature size of ICs (integrated circuits) continues to decrease, electron beam lithography has been found suitable for higher image resolution. Electron beam lithography (viz., electron beam exposure) has the advantage of being able to eliminate the need for reticles or masks each representing a circuit pattern to be formed. As is known, the electron beam exposure is able to directly write or draw patterns in accordance with circuit design data outputted from a CAD (computer aided design) system.

Unfortunately, high-quality electron beam systems are expensive. Further, due to the time-consuming sequential nature of the exposure method, production rates are low compared to the mask techniques of optical lithography. Thus, electron beam lithography is typically used to produce semiconductor devices, such as ASICs (application specific integrated circuits), custom ICs (integrated circuit), etc., each of which is of multi-sort but small-production quantities and which is required to be delivered within a limited time.

The sequence of IC fabrication consists of multiple processing steps that add, alter and remove thin layers. Each of these processing steps requires extremely strict alignment or registration. To this end, alignment marks are formed on a semiconductor wafer and are used as references for aligning at each processing step.

According to conventional optical lithography (photolithography), an alignment mark, which is to be used in a subsequent step, is formed in each chip region during the first exposing process via which cell segregation layers are formed. That is, the cell segregation layers can be formed in the range of alignment precision of a stepper itself. Accordingly, in the case of photolithography, there is no need to provide a processing step dedicated to forming the alignment marks.

On the other hand, in the case of electron beam lithography, the alignment is implemented by detecting electron beams reflected at an alignment mark. The alignment mark is formed so as to have a height sufficient to enable the detection of the mark in the manner disclosed. Therefore, in the case of electron beam lithography, it is necessary to provide a processing stage which is dedicated to forming alignment marks prior to the first actual IC fabrication process of forming cell separation layers.

One conventional technique in connection with the electron beam alignment marks will be described with reference to FIG. 1.

As shown in FIG. 1, a silicon semiconductor wafer 10 is provided with a plurality of alignment marks 12. These marks are respectively formed within corresponding chip regions 14 each of which is square or rectangular and indicated by a broken line. Each alignment mark is cross-shaped in this particular case. Throughout the instant disclosure, the term "chip region" implies a region on which electronic circuitry is to be formed. After all the processing steps on the wafer have ebeen completed, the wafer is cut into a plurality of chips (viz., diced) and packaged. The area or region between adjacent chip regions 14 is a dicing region or margin.

The chip regions 14 respectively carry the cross-shaped alignment marks 12 in the same positions thereof, each of which has been determined considering the size of the chip to be fabricated and the arrangement of the chip regions 14. In order to prepare such an alignment mark, a reticle is prepared taking the chip size into account. Thereafter, the mark 12 is formed via photolithographic techniques using step-repeat optical exposure of a stepper. The linear strip-like spaces, which are formed between the adjacent chip regions 14, are dicing regions or scribe lines along which the wafer is cut into individual chips.

There are two types of alignment techniques used for implementing electron beam exposure: one is die-by-die alignment carried out at each chip region and the other is global alignment for aligning the entire wafer surface. An EGA (enhanced global alignment) method disclosed in the Japanese Patent Application Tokkai-hei No. 8-181066 is classified as one kind of the global alignment. In order to implement the electron beam exposure using the global alignment, it is necessary to detect a plurality of alignment marks 12.

The chip size and the number of chip regions on one wafer are different with different ASICs and custom ICs. Therefore, the aforesaid conventional technique has encountered the problem that the chip size can not be determined until the circuit design is completely finished, which results in a long turnaround time. Especially, in the case where different reticles must be prepared with different chip sizes, the conventional technique suffers from the difficulty that the turnaround time become extremely long.

SUMMARY OF THE INVENTION

It is therefore an object of the present to provide a method of implementing electron beam lithography using uniquely positioned alignment marks.

Another object of the present invention is to provide a wafer with alignment marks formed in a region which is not affected by chip size and chip region arrangement.

In brief, these objects are achieved by an arrangement wherein a plurality of alignment marks are formed on a semiconductor wafer in an area outside a plurality of chip regions, such as in a periphery of the wafer, irrespectively of the size and arrangement of the chip regions. Such wafers, which are previously manufactured, are then subjected to electron beam exposure in accordance with circuit design data. The electron beam exposure is typically implemented through global alignment using the alignment marks.

One aspect of the present invention resides in a method of forming electronic circuitry on a semiconductor wafer using electron beam lithography, comprising the steps of: (a) forming, on the wafer, a plurality of alignment marks in an area on which a plurality of chip regions in which the electronic circuitry is to be formed, are absent; and (b) implementing a series of processing steps for forming the electronic circuitry in the chip regions using the alignment marks for alignment.

Another aspect of the present invention resides in a semiconductor wafer on which electronic circuitry is to be formed in each of a plurality of scheduled chip regions using electronic beam lithography, characterized in that the wafer carries a plurality of alignment marks formed in an area which is separated or distinct from that in which the plurality of scheduled chip regions are formed.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

Figure 1:
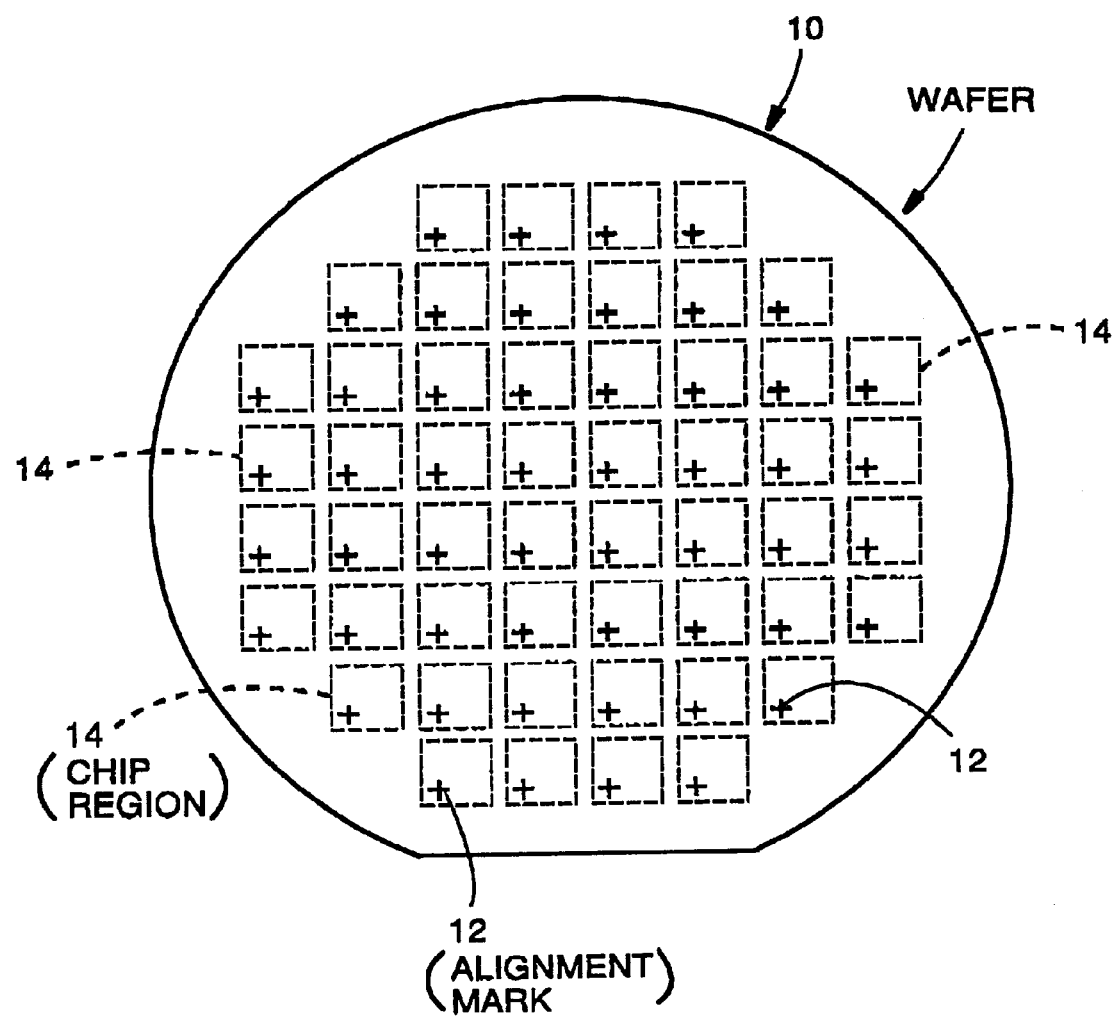
FIG. 1 is a diagram showing a conventional arrangement of alignment marks on a wafer, which was referred to in the preceding paragraphs.

Before discussing the present invention with reference to the drawings, it is deemed preferable to briefly describe the principles underlying the present invention.

According to the present invention, it is assumed that the alignment or registration during the electron beam exposure is implemented using global alignment. The alignment marks are formed in the region, such as about the periphery of a wafer, which are not included in any chip region. The positions, at which the alignment marks are formed, are in the region in which the chips are not formed but which is, however, preferably subjected to the subsequent fabrication steps such as layer deposition or etching. Such positions are defined about a wafer's peripheral area but reseparated from the wafer's edge by slightly more than 5 mm (for example), and/or are located in an area which becomes a dicing area irrespectively of chip sizes.

A semiconductor wafer may be round if the wafer is not provided with an orientation flat, and has a center point in the vicinity of the supposed round's center point. Since a plurality of chips are cut from a semiconductor wafer using a dicing saw, each dicing region (viz., scribe line) is a strip-like region which crosses the semiconductor wafer. Therefore, the chip regions are provided in a manner that a group consisting of 2×2 chip regions is symmetrically repeated in two-dimensional directions on the wafer. The center point of the wafer therefore becomes the symmetrical center point of the chip regions arranged in lattice. The center point accordingly is included in the dicing region irrespective of the chip size and thus, an alignment mark can be provided at this center point.

More specifically, the center point of a wafer is typically included in a crossed area of two dicing regions in parallel with and normal to the orientation flat and accordingly, an alignment mark may be provided thereat.

An alignment mark, which is made of a semiconductor material, is a step formed on the wafer. As an alternative, an alignment mark is made of metal, such as a heavy metal, which is formed on the wafer and which is able to reflect a large amount of electrons when bombarded by an electron beam.

The number of alignment marks to be provided will be considered below. Three alignment marks, which are not provided on a straight line, mathematically define one plane, and thus are used to implement minimum global alignment. However, in order to achieve high alignment accuracy, it is important to provide four and more alignment marks. In this case, as the area of a polygon defined by a plurality of alignment marks becomes large, the alignment accuracy increases and therefore, it is preferable to provide six or more alignment marks around the periphery of the wafer. Further, in order to compensate for local distortion, it is preferable to provide an alignment mark at the center portion of the semiconductor wafer.

The alignment, carried out during the electron beam exposure, is accomplished by detecting the amount of electrons reflected by the mark. Once an alignment mark has been used, its shape tends to be deteriorated and thus, when the once-used alignment mark is again utilized, it is difficult to expect high alignment precision at the subsequent process. Further, a resist material may incidentally become attached to the alignment mark, resulting in a lowering of the alignment accuracy. As a result, each alignment mark should be used only once for the alignment purpose (viz., should be a disposable). Therefore, a plurality of alignment mark groups are prepared, and each of the groups consists of the alignment marks whose number meets the number of processes each requiring one alignment mark. In this case, it is advantageous to provide at least three groups (preferably four and more groups) around the peripheral portion of the semiconductor wafer. Once a gate electrode(s) or connection wire(s) has been formed on the wafer, it can be used for alignment. Therefore, it is sufficient if the above mentioned alignment marks are available in each process until the process for patterning the gate electrodes. It is therefore understood that when a plurality of alignment marks are grouped and then provided, the number of alignment marks in each group is determined so as to meet the number of process steps until the patterning of gate electrodes.

Figure 2:
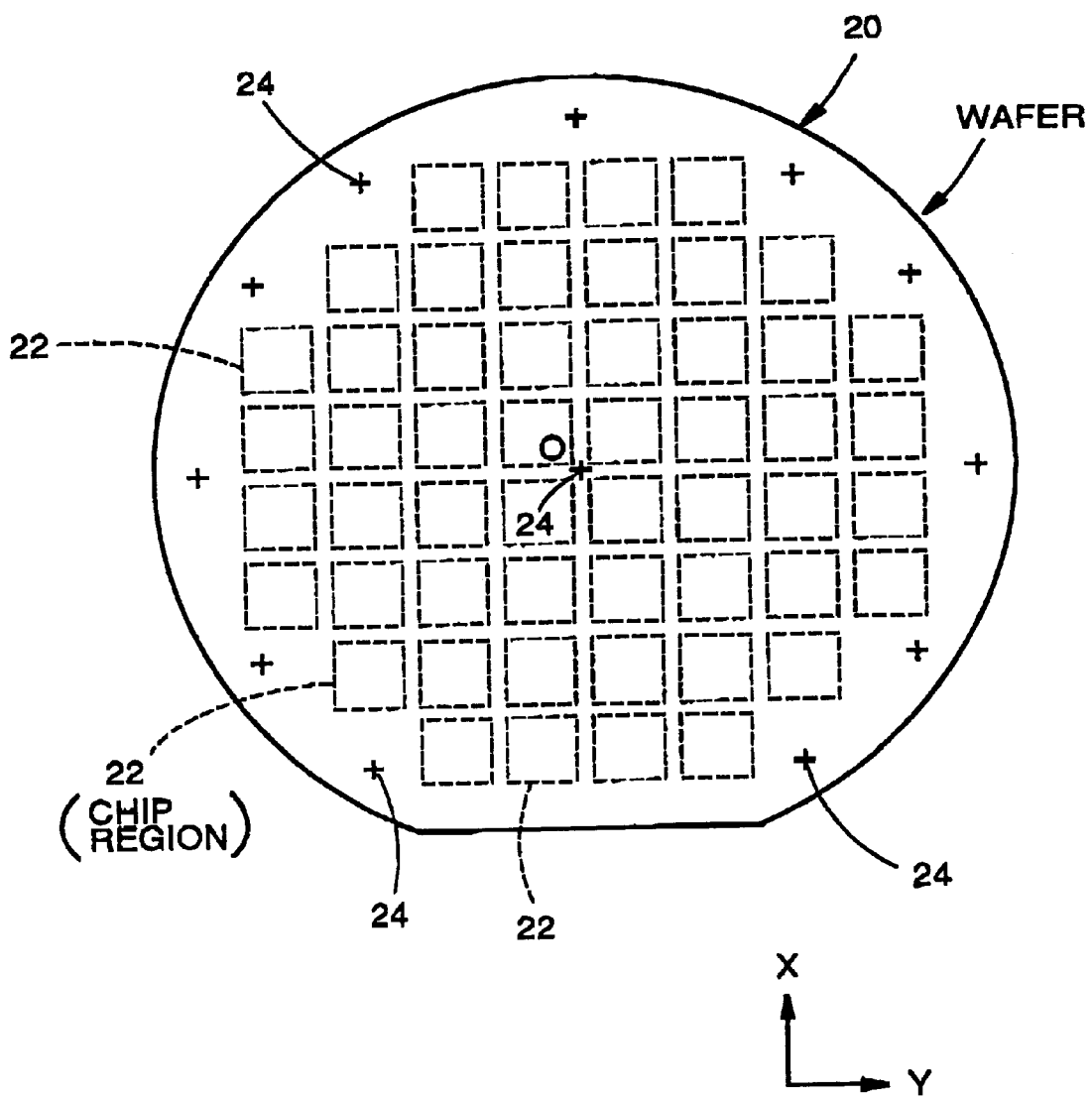
FIG. 2 is a diagram showing a first embodiment of the present invention.
Figure 3A:
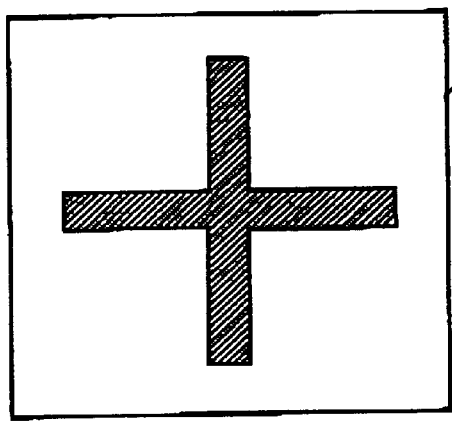
FIGS. 3(A) to 3(D) are each diagrams showing the examples of the shapes of the alignment mark may assume.
Figure 3B:
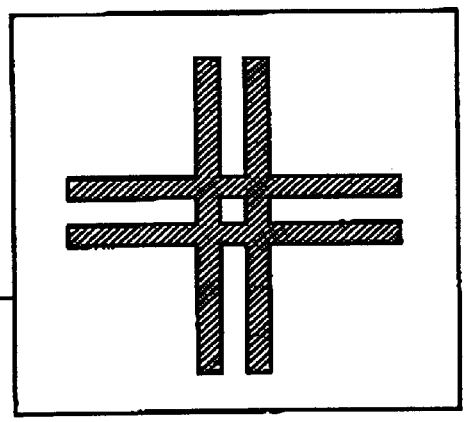
Figure 3C:
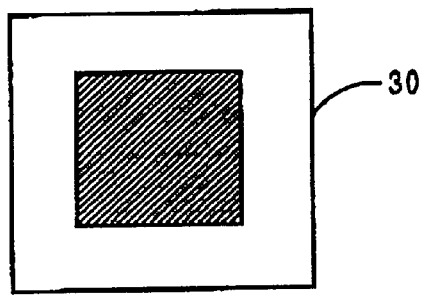
Figure 3D:
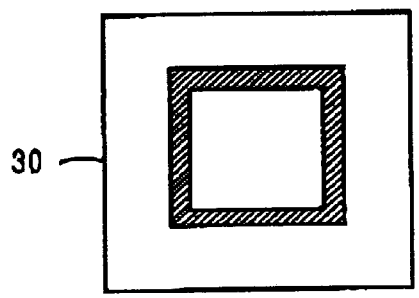
Figure 4:
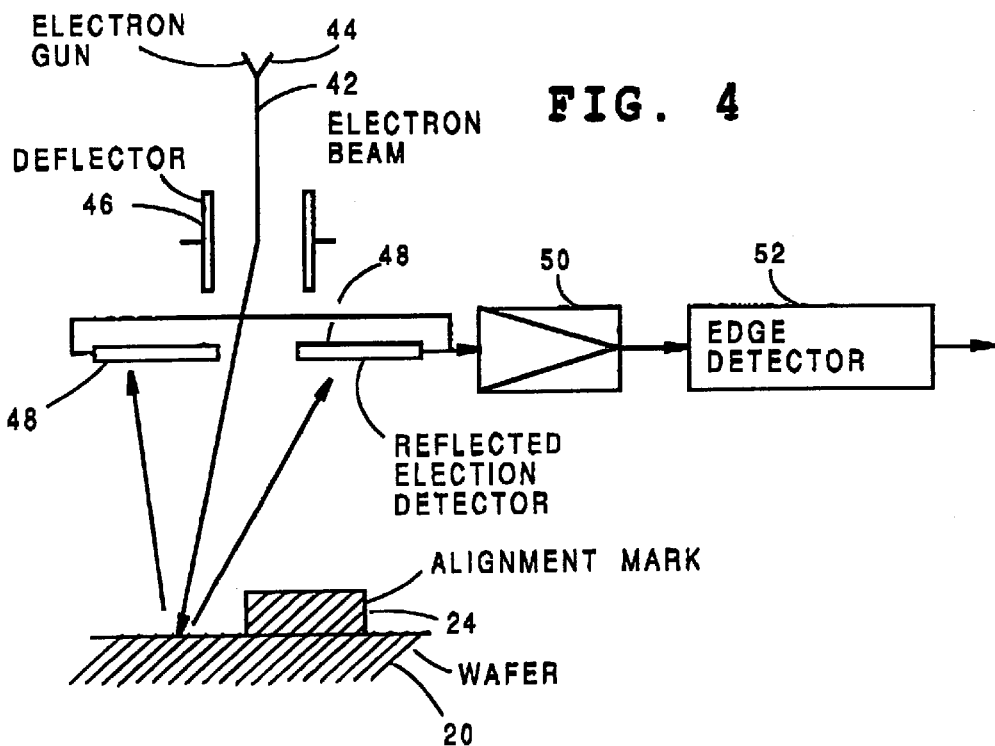
FIG. 4 is a diagram schematically showing a technique via which an alignment mark is detected.

Referring to FIGS. 2–4, a first embodiment of the present invention will be described.

A semiconductor wafer 20 is made of silicon and is provided with substantially rectangular chip regions 22 whose number is preferably an even multiple of four (merely for example). As shown in FIG. 2, a plurality of the chip regions 22, amounting to fifty-two (52) in total and having sizes or shapes identical with each other, are arranged in a lattice. That is, the chip regions 22 are arranged, from top to bottom, in a manner of one row including 4 chip regions, one row including 6 chip regions, four rows each including 8 chip regions, one row including 6 chip regions, and one row including 4 chip regions. Accordingly, the center point surrounded by four center chip regions coincides with a center point O of the wafer 20 and is located in a dicing region. It is understood that if all the chip regions 22 are symmetrically formed, the center point of symmetrical arranged chip regions 22 is coincidental with the wafer's center point O irrespective of the chip sizes.

A cross-shaped alignment mark 24 is provided at the wafer's center point O. Further, other eleven cross-shaped alignment marks 24 are substantially equally spaced about the periphery of the semiconductor wafer 20 in a manner where each of the marks is located at a predetermined distance (5 mm for example) from the wafer's edge.

As mentioned above, the center point O of the wafer 20 is uniquely defined, the center point O coincides with the center point of the chip arrangement and is located in the dicing region. As long as the chip regions 22 are each equally shaped and are arranged in the lattice, the above mentioned relationship coincidence is not affected irrespective of the facts that the size of each chip region is uniformly changed, and the number of the chip regions 22 varies. Accordingly, the alignment mark 24 at the wafer's center point O is always located outside the chip regions 22 irrespective of the fact of the chip size and the number of the chip regions 22.

The periphery of the semiconductor wafer 20 is the area used for holding and transporting the wafer 20 between fabrication processes, and is not typically subjected to any fabrication process such as layer deposition. Such a peripheral region has a width of approximately 5 mm from the wafer's edge (by way of example). In accordance with the instant embodiment, each of the alignment marks 24, provided at the periphery of the semiconductor wafer 11, is located in a region which is slightly inside the peripheral region provided for wafer holding and transportation and which is therefore uniformly subjected to layer deposition and etching. It is understood that each of the peripheral positions at which the marks 24 are formed is outside the chip regions 22 irrespective of the chip size.

Each alignment mark 24 may be formed using photolithography or electron beam lithography. When photolithography is used, the alignment mark 24 is formed using a so-called shot map function of a stepper after preparing a reticle having only a pattern representing the alignment mark 24. It is understood that the above mentioned reticle has no relationship with the kinds of ASICs and custom ICs to be manufactured. Further, it is sufficient to prepare only one reticle which can commonly be used for forming the alignment mark 24.

The shapes of the alignment marks 24 will be described. Each alignment mark 24 is made of a semiconductor material such as silicon and is formed so as to have a step height of about more than 0.3 $\mu$m (for example). As an alternative, the alignment mark 24 can be formed using a suitable heavy metal, in the case of which the step height may be less than 0.3 $\mu$m (for example). The alignment mark 24 is preferably shaped such as to have one or more edge sides parallel with each of X- and Y-axes of the semiconductor wafer 11. The length of the side has a range approximately between 30 and 50 $\mu$m (for example).

FIGS. 3(A)–3(D) show examples of possible shapes of the alignment mark 24. In the drawings, each of the hatched portions indicates a portion that is higher or lower than the surrounding portion thereof.

When a stair or step made of silicon is formed on the wafer 20, the region defined between a rectangle 30 depicted by a solid line and the hatched portion, is lowered or etched using a positive resist. In this case, the hatched portion has the same level as the other region of the wafer 20 at the stage of forming the alignment marks 24.

As shown in FIG. 2, a plurality of alignment marks 24 are formed on the semiconductor wafer 20. As mentioned above, each alignment mark 24 is formed in a region separate from that for the chip regions 22 irrespective of the chip size and the number of chips formed on the wafer. Therefore, at the stage of forming the alignment marks 24, there is no need to have determined the chip size and the arrangement of the chip regions 22. Thereafter, with the aid of a CAD system, the circuit pattern, the chip size, and the arrangement of the chip regions 22 on the wafer 11, are determined. When the designed chip regions 22 on the wafer 20 have been completed, the electron beam patterning is implemented on the wafer 20, at the time of which the exposure alignment is implemented. In the instant embodiment, it is assumed that each alignment mark 24 Is used, by way of global alignment, to compensate for shift, gain, rotation, etc.

Figure 5A:
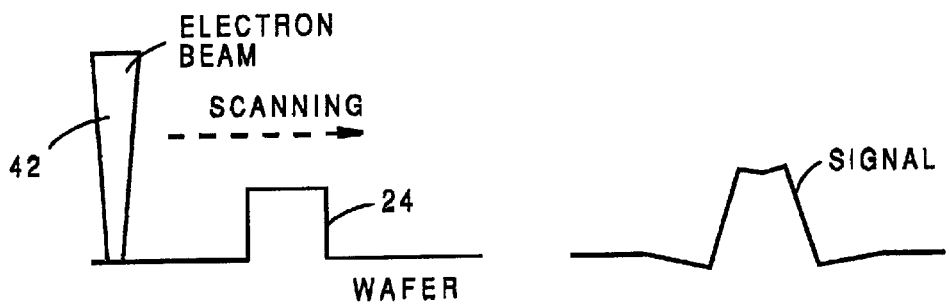
FIGS. 5(A) and 5(B) are each diagrams showing a manner in which an alignment mark indicating signal is generated.
Figure 5B:
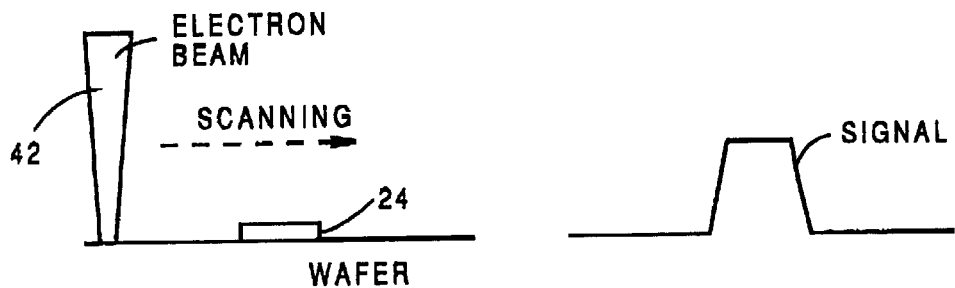

FIG. 4 is a drawing schematically showing a principle of detecting the alignment mark 24 during electron beam exposure. An electron beam 42 emitted from an electron gun 44 is deflected and scanned by a deflector 46 over the wafer 20. Reflected or backscattered electrons, which occur when the electron beam 42 bombards the surface of the wafer 20, are detected by a reflected electron detector 48 comprising a plurality of multi-channel plates. The reflected electrons thus detected, are amplified at an amplifier 50 and fed to an edge detector 52. While scanning the wafer 20 using the electron beam 42, the edges of the alignment mark 24 are detected by the edge detector 52 whereby the position of the alignment mark 24 on the wafer 20 can be ascertained. FIG. 5(A) shows a relationship between the electron beam scanning and the resulting electrical signal in the case where the alignment mark 24 is a step made of silicon. On the other hand, FIG. 5(B) illustrates a relationship between the electron beam scanning and the obtained electrical signal when the alignment mark 24 is made of a heavy metal.

As mentioned above, according to the instant embodiment, the alignment marks 24 are formed in the area outside the chip regions 24 irrespective of the chip size. Therefore, before determining the circuit pattern in each chip region and the overall arrangement of chip regions on the wafer, it is possible to implement the step of forming the alignment marks, This is very advantageous because it is possible to use a single type of wafers each of which carries the above mentioned alignment marks 24.

In the above, it goes without saying that the location of each of the alignment marks 24 is exemplary and that the invention is in no way limited thereto.

Figure 6:
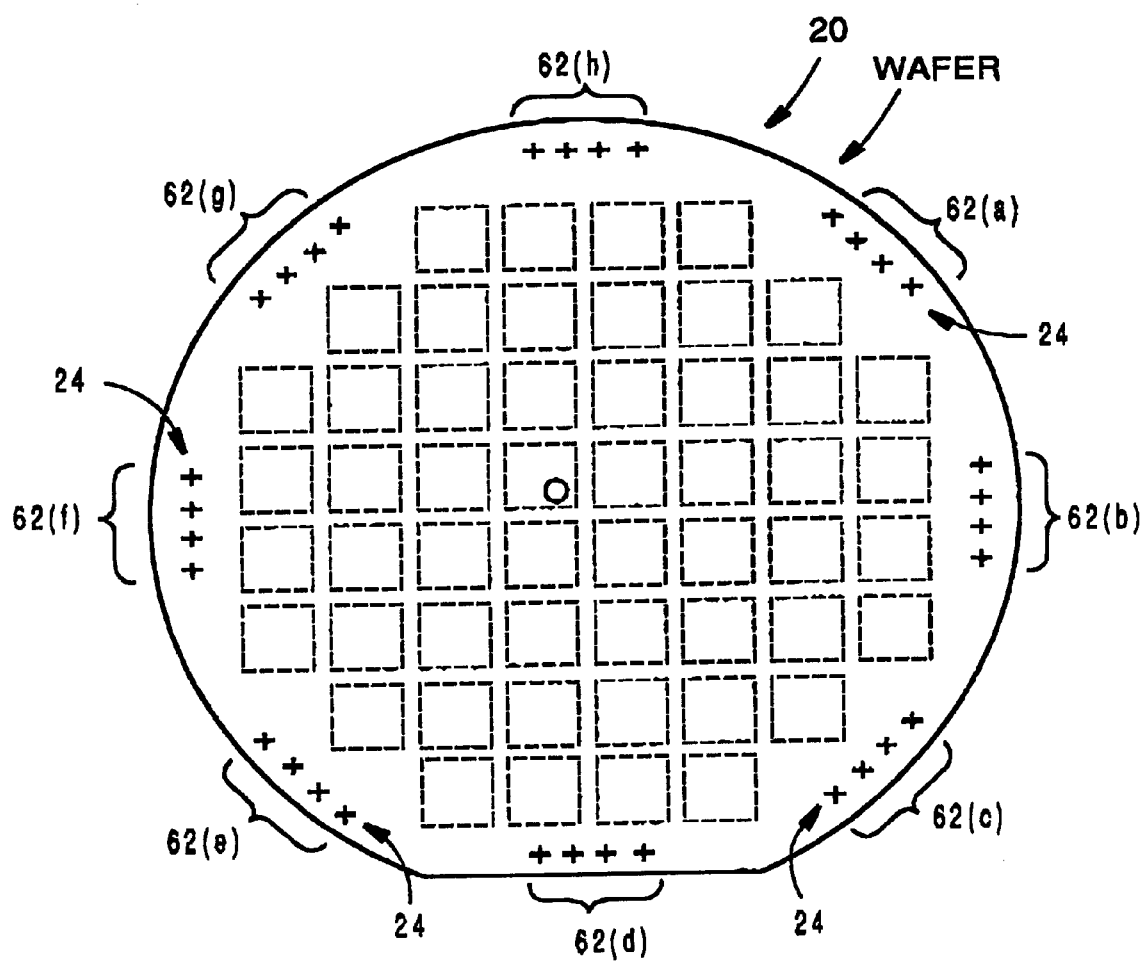
FIG. 6 is a diagram showing a second embodiment of the present invention.

Reference is now made to FIG. 6, wherein a second embodiment of the present invention is illustrated. As shown, no alignment mark is formed at the center point O of the wafer 20. A plurality of alignment marks 24 are grouped and formed only about the periphery of the wafer 20. That is, eight groups 62(a)–62(h), each of which comprises four alignment marks 24, are provided at substantially equal intervals. The reason why the multiple alignment marks 24 are grouped is that a mark is not used twice. Therefore, the number of the alignment marks 24 in each group corresponds to the number of IC fabrication processes wherein the mark is indispensable for alignment. In more specific terms, once the gate electrodes or metal connection lines are formed, these layer elements are able to be utilized for alignment and hence, it is sufficient if each group includes the alignment marks the number of which equals the number of fabrication processes until forming the electrodes, etc.

With the second embodiment, there is no alignment mark at the wafer's center point O and as such, it is possible to form an odd number's chip regions on the semiconductor wafer.

Figure 7:
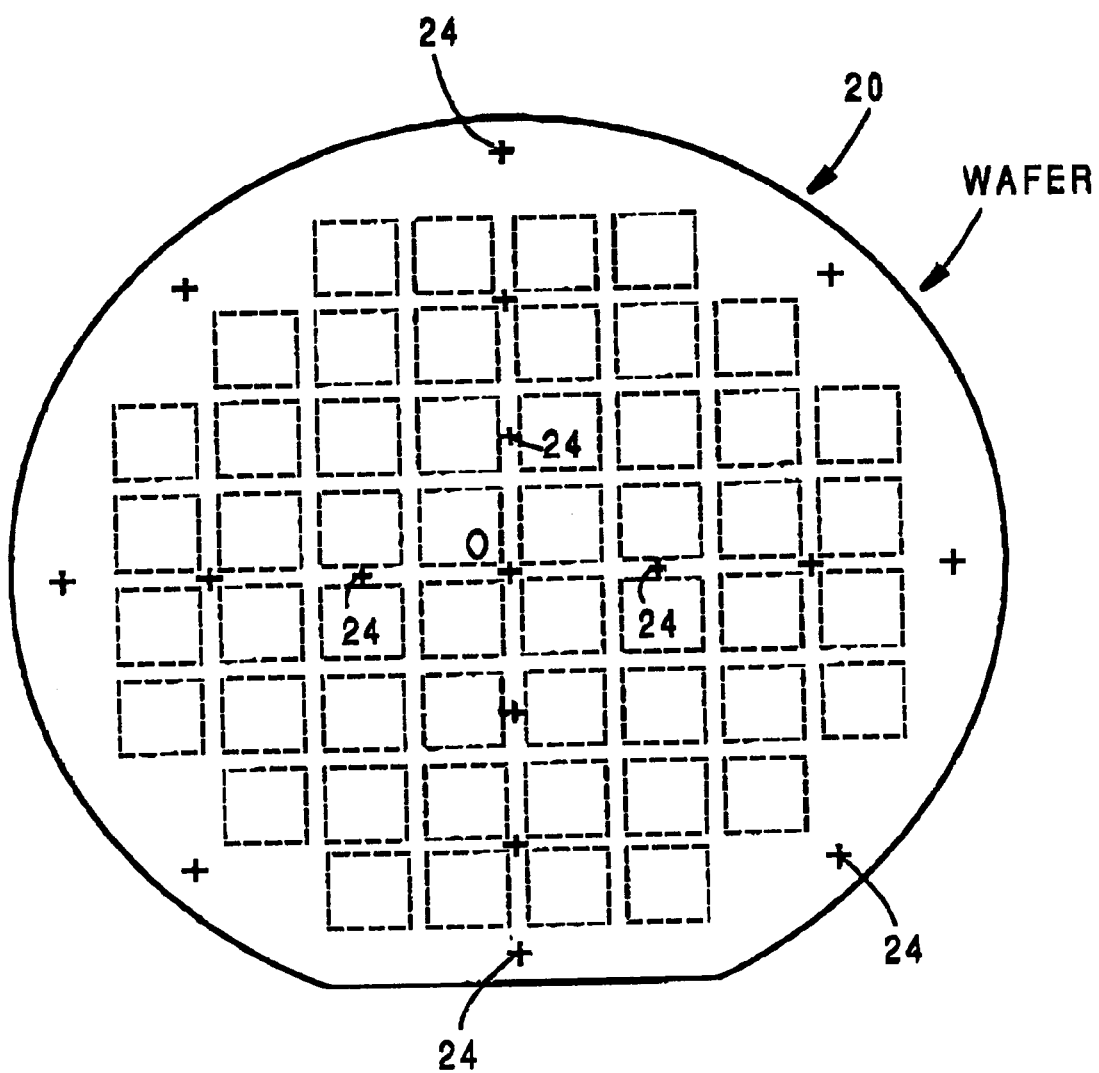
FIG. 7 is a diagram showing a third embodiment of the present invention.

A third embodiment of the present invention will be described with reference to FIG. 7. As shown, the wafer 20 according to the third embodiment is further provided with additional eight alignment marks 24 compared to the first embodiment of FIG. 1. Since the chip regions 22 are symmetrically provided with respect to orthogonal (vertical and horizontal) lines passing through the center point O, the additional alignment marks 24 can be formed on the two strip-like dicing regions which intersect at the wafer's center point O. By thus providing the alignment marks 24, the alignment can be made precisely without being affected by local distortion of the wafer 20.

It will again be understood that the above disclosure is representative of only three possible embodiments of the present invention and that the concept on which the invention is based is not specifically limited thereto.

What is claimed is:

1. A method of forming electronic circuitry on a semiconductor wafer using electron beam lithography, comprising:

(a) forming, on said wafer, a plurality of alignment marks in an area proximate to a periphery of said wafer and distinct from an area of a plurality of chip regions in which said electronic circuitry is to be formed; and (b) implementing a series of processing steps for forming said electronic circuitry in said chip regions using said alignment marks, wherein an additional alignment mark is formed at said center point of said wafer distinct from an area in which said electronic circuitry is to be formed.

2. The method as claimed in claim 1, wherein said alignment marks are comprised of a plurality of groups, each of which includes a plurality of alignment marks wherein each alignment mark is used for a number of processing steps which is less than the total number of processing steps.

3. The method as claimed in claim 1, wherein said plurality of chip regions are symmetrically arranged on said wafer and wherein at least one additional alignment mark is provided on regions of the wafer which extend parallel and normal to an orientation flat of said wafer and which pass through a center point of said wafer, said center point of the wafer distinct from an area in which said electronic circuitry is to be formed.

4. A semiconductor wafer on which electronic circuitry is to be formed in each of a plurality chip regions using electron beam lithography, wherein said wafer carries a plurality of alignment marks formed in an area proximate to a periphery of said wafer and separate from an area of said plurality of scheduled chip regions and wherein an additional alignment mark is formed at said center point of said wafer distinct from an area in which said electronic circuitry is to be formed.

5. The semiconductor wafer as claimed in claim 4, wherein said alignment marks are comprised of a plurality of groups each of which includes a plurality of alignment marks wherein each alignment mark is used for a number of wafer processing steps which is less than the total number of processing steps.

6. The semiconductor wafer as claimed in claim 4, wherein said plurality of chip regions are symmetrically designed on said wafer and wherein at least one additional alignment mark is provided on regions of the wafer which extend parallel and normal to an orientation flat of said wafer and which pass through a center point of said wafer, said center point of the wafer distinct from an area in which said electronic circuitry is to be formed.

* * * * *